(12) United States Patent
Abe et al.

(10) Patent No.: US 12,527,122 B2
(45) Date of Patent: Jan. 13, 2026

(54) NITRIDE SEMICONDUCTOR LIGHT EMITTING ELEMENT

(71) Applicant: NICHIA CORPORATION, Anan (JP)

(72) Inventors: Hiroki Abe, Komatsushima (JP); Tomoya Yamashita, Anan (JP); Kenji Uchida, Anan (JP)

(73) Assignee: NICHIA CORPORATION, Anan (JP)

( * ) Notice: Subject to any disclaimer, the term of this patent is extended or adjusted under 35 U.S.C. 154(b) by 949 days.

(21) Appl. No.: 17/557,221

(22) Filed: Dec. 21, 2021

(65) Prior Publication Data
US 2022/0199855 A1    Jun. 23, 2022

(30) Foreign Application Priority Data

Dec. 23, 2020   (JP) ................... 2020-214049
Aug. 31, 2021   (JP) ................... 2021-141352

(51) Int. Cl.
*H10H 20/812*    (2025.01)
*H10H 20/01*    (2025.01)
*H10H 20/81*    (2025.01)
*H10H 20/825*    (2025.01)

(52) U.S. Cl.
CPC .... *H10H 20/812* (2025.01); *H10H 20/01335* (2025.01); *H10H 20/81* (2025.01); *H10H 20/8215* (2025.01); *H10H 20/825* (2025.01)

(58) Field of Classification Search
CPC .......... H10H 20/812; H10H 20/01335; H10H 20/81; H10H 20/8215; H10H 20/825; H10H 20/8252
See application file for complete search history.

(56) References Cited

U.S. PATENT DOCUMENTS

| | | |
|---|---|---|
| 2002/0053676 A1 | 5/2002 | Kozaki |
| 2003/0205736 A1 | 11/2003 | Kozaki |
| 2005/0098789 A1 | 5/2005 | Kozaki |
| 2006/0131604 A1 | 6/2006 | Kozaki |

(Continued)

FOREIGN PATENT DOCUMENTS

| | | |
|---|---|---|
| JP | 2002-223042 A | 8/2002 |
| JP | 2008-103711 A | 5/2008 |

(Continued)

*Primary Examiner* — Andres Munoz
(74) *Attorney, Agent, or Firm* — Foley & Lardner LLP

(57) ABSTRACT

A nitride semiconductor light emitting element includes: an n-side nitride semiconductor layer; a p-side nitride semiconductor layer; and an active layer disposed between the n-side nitride semiconductor layer and the p-side nitride semiconductor layer and comprising a plurality of stacks, each comprising a well layer and a barrier layer. The well layers include, successively from the n-side nitride semiconductor layer side, a first well layer, a second well layer, and a third well layer that is positioned closest to the p-side nitride semiconductor layer among the well layers. A thickness of the second well layer is greater than a thickness of the first well layer. A thickness of the third well layer is greater than the thickness of the second well layer. Among the barrier layers, the first barrier layer, which is positioned between the third well layer and the p-side nitride semiconductor layer, is doped with a p-type impurity.

17 Claims, 3 Drawing Sheets

(56) References Cited

U.S. PATENT DOCUMENTS

| | | |
|---|---|---|
| 2007/0241353 A1* | 10/2007 | Taki ................ B82Y 20/00 |
| | | 257/94 |
| 2008/0029758 A1 | 2/2008 | Kozaki |
| 2008/0093593 A1 | 4/2008 | Ryu |
| 2008/0135868 A1* | 6/2008 | Okagawa ............ H10H 20/811 |
| | | 257/E33.064 |
| 2010/0080257 A1 | 4/2010 | Lee et al. |
| 2010/0252811 A1 | 10/2010 | Kozaki |
| 2011/0187294 A1* | 8/2011 | Bergmann .......... H10H 20/811 |
| | | 315/363 |
| 2013/0056707 A1 | 3/2013 | Kozaki |
| 2013/0168637 A1* | 7/2013 | Teranishi ............ H10H 20/811 |
| | | 257/13 |
| 2014/0203242 A1 | 7/2014 | Kozaki |
| 2014/0240975 A1 | 8/2014 | Lee et al. |
| 2015/0076447 A1 | 3/2015 | Tani et al. |
| 2015/0364649 A1 | 12/2015 | Kozaki |

FOREIGN PATENT DOCUMENTS

| | | |
|---|---|---|
| JP | 2010-087463 A | 4/2010 |
| JP | 2011-054834 A | 3/2011 |
| JP | 2014-165498 A | 9/2014 |
| JP | 2017-037873 A | 2/2017 |
| JP | 2019-004160 A | 1/2019 |
| WO | WO-2014/061692 A1 | 9/2016 |

* cited by examiner

NITRIDE SEMICONDUCTOR LIGHT EMITTING ELEMENT

CROSS-REFERENCE TO RELATED APPLICATION

This application claims priority to Japanese Patent Application No. 2020-214049, filed on Dec. 23, 2020, and Japanese Patent Application No. 2021-141352, filed on Aug. 31, 2021, the disclosures of which are hereby incorporated by reference in their entireties.

BACKGROUND

The present disclosure relates to a nitride semiconductor light emitting element.

A nitride semiconductor light emitting element equipped with an active layer having a multiple quantum well structure in which well layers and barrier layers are alternately stacked has been known. Japanese Patent Publication No. 2017-037873, Japanese Patent Publication No. 2014-165498, and Japanese Patent Publication No. 2008-103711, in particular, disclose layering structures in which the thicknesses of the well layers differ from one another. Furthermore, PCT Publication No. WO 2014/061692 (particularly paragraph [0078]) discusses the fact that all of the barrier layers in the multiple quantum well radiative layers may possibly be doped with a p-type impurity due to the heat diffusion during the process of growing a p-type nitride semiconductor layer.

SUMMARY

The emission efficiency of any of the nitride semiconductor light emitting elements described above is hardly sufficient, and there remains a need to further improve the emission efficiency. One of the objects of the present disclosure is to provide a nitride semiconductor light emitting element having improved emission efficiency.

According to one embodiment of the present disclosure, a nitride semiconductor light emitting element includes an n-side nitride semiconductor layer, a p-side nitride semiconductor layer, and an active layer disposed between the n-side nitride semiconductor layer and the p-side nitride semiconductor layer and including a plurality of stacks each comprising a well layer and a barrier layer. The well layers include, successively from the n-side nitride semiconductor layer side, a first well layer, a second well layer, and a third well layer that is positioned closest to the p-side nitride semiconductor layer among the well layers. The second well layer is larger in thickness than the first well layer. The third well layer is larger in thickness than the second well layer. Among the barrier layers, the first barrier layer that is positioned between the third well layer and the p-side nitride semiconductor layer is doped with a p-type impurity.

A nitride semiconductor light emitting element according to the present disclosure as constructed above can promote emission efficiency improvement.

DETAILED DESCRIPTION

Figure 1:
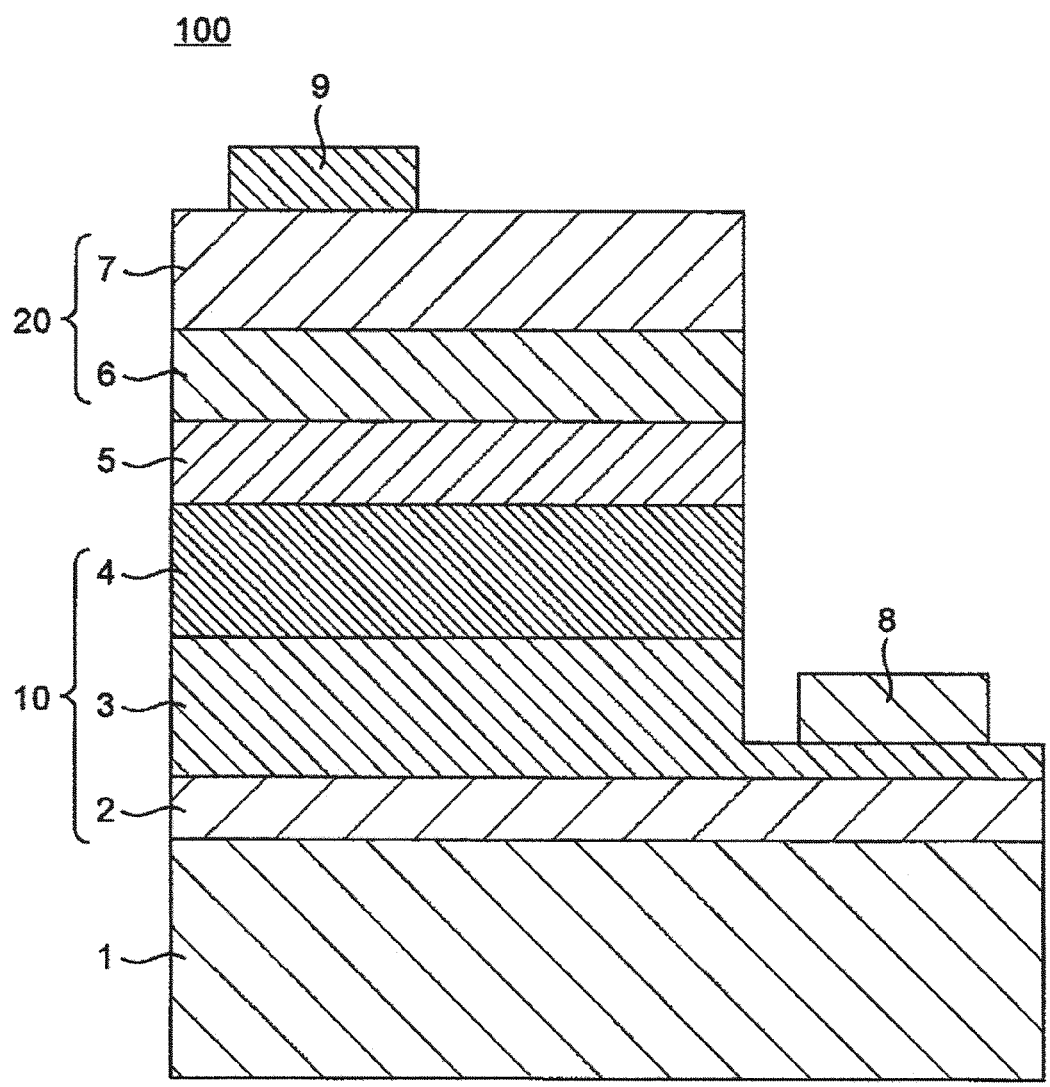
FIG. 1 is a cross-sectional view of the structure of a nitride semiconductor light emitting element according to the present disclosure.

It is generally believed that the emission efficiency of a semiconductor light emitting element that includes an active layer having a multiple quantum well structure in which well layers and barrier layers are alternately stacked can be increased by allowing all of the well layers to efficiently emit light. However, because electrons are supplied from the n-side nitride semiconductor layer and holes are supplied from the p-side nitride semiconductor layer, it is not necessarily easy to uniformly supply electrons or holes to all of the well layers. In a nitride semiconductor light emitting element that includes nitride semiconductor layers, in particular, it is not easy to efficiently supply holes from the p-side nitride semiconductor layer to all of the well layers included in the active layer. The supply of holes tends to be lopsided where more holes are supplied to the well layers positioned closer to the p-side nitride semiconductor layer. In the case of a nitride semiconductor light emitting element, in particular, the well layers positioned closer to the n-side nitride semiconductor layer are scarcely supplied with holes, making it difficult to increase the emission efficiency of the well layers positioned closer to the n-side nitride semiconductor layer.

Embodiments of the present disclosure were developed as a result of diligent studies based on the knowledge described above, and it is an object of certain embodiments to improve the emission efficiency of the active layer as a whole rather than allowing all of the well layers included in the active layer to emit light.

Specifically, because a first well layer among the well layers, which is positioned close to the n-side nitride semiconductor layer and barely supplied with holes, does not significantly contribute to emission, it is preferable to reduce the emission of the first well layer while increasing the supply of electrons to the well layers positioned closer to the p-side nitride semiconductor. Accordingly, the first well layer is formed to a smaller thickness than the thicknesses of the well layers positioned closer to the p-side nitride semiconductor to thereby allow electrons to be more readily supplied to the well layers positioned closer to the p-side nitride semiconductor. As such, the first well layer contributes to allowing the well layers positioned closer to the p-side nitride semiconductor layer than the first well layer to efficiently emit light, and as a result makes it possible to provide a nitride semiconductor light emitting element having a low forward voltage.

Furthermore, the third well layer that is positioned closest to the p-side nitride semiconductor layer and amply supplied with holes from the p-side nitride semiconductor layer is a well layer in which the electrons supplied via the first well layer recombine with the holes supplied from the p-side nitride semiconductor layer to predominantly contribute to emission among the well layers. Accordingly, the third well layer is formed to have a larger thickness than the other well layers including the first well layer so as to facilitate efficient radiative recombination in the third well layer.

A second well layer, which has a larger thickness than the first well layer, but a smaller thickness than the third well layer, contributes to emission and is a layer for reducing crystallinity degradation. Growing the third well layer by changing from the thickness of the first well layer that is thinner than the second well layer to the thickness of the third well layer that is thicker than the second well layer without interposing a second well layer tends to degrade the crystallinity of the third well layer. Based on this knowledge of the present inventors, providing, between the first well layer and the third well layer, a second well layer that is thicker than the first layer but thinner than the third well layer can reduce the crystallinity degradation of the third well layer.

Furthermore, among the barrier layers, the first barrier layer positioned between the third well layer and the p-side nitride semiconductor layer is doped with a p-type impurity in order to efficiently inject holes into the third well layer or the second well layer.

The nitride semiconductor light emitting element as constructed above, in which the first, second, and third well layers in the active layer are formed to have different thicknesses, and the first barrier layer positioned between the third well layer and the p-side nitride semiconductor layer, among the barrier layers, is doped with a p-type impurity as described earlier, can have improved emission efficiency.

A more specific embodiment will be explained below. In the nitride semiconductor light emitting elements according to the embodiments described below, the nitride semiconductors that can be used include the group III-V nitride semiconductors $(In_XAl_YGa_{1-X-Y}N$ $(0 \leq X, 0 \leq Y, X+Y \leq 1))$, those in which B is used for some of the group III elements, and mixed crystals in which the group V element N is replaced with P, As, or Sb. These nitride semiconductor layers can be formed by, for example, metal-organic chemical vapor deposition (MOCVD), hydride vapor phase epitaxy (HVPE), molecular-beam epitaxy (MBE), or the like.

As a nitride semiconductor light emitting element according to any of the embodiments, a nitride semiconductor light emitting element having a relatively high In composition ratio in each well layer in the active layer and a peak emission wavelength of at least 500 nm may be used. For example, a green light emitting element that includes $In_aGa_{1-a}N$ well layers having the In composition ratio a of 20 to 28 may be used. In the present specification, when a range is described using numbers such as in A to B, the instance in which the value is A and the instance in which the value is B are included. In the present specification, moreover, an undoped semiconductor layer is a layer formed without using a source gas (e.g., a gas containing Si or Mg) for intentionally doping the layer with an impurity for controlling the conductivity, but may contain an impurity inevitably mixed in during the process. The n-type impurity concentration of an undoped semiconductor layer is, for example, $1.0 \times 10^{17}/cm^3$ at most.

First Embodiment

A nitride semiconductor light emitting element according to a first embodiment of the present disclosure will be explained below with reference to FIG. 1 and FIG. 2. The nitride semiconductor light emitting element 100 according to this embodiment includes a substrate 1, an n-side nitride semiconductor layer 10 disposed on the substrate 1, a p-side nitride semiconductor layer 20, and an active layer 5 positioned between the n-side nitride semiconductor layer 10 and the p-side nitride semiconductor layer 20. The active layer 5 in the nitride semiconductor light emitting element of the present disclosure will be explained first, followed by the substrate 1, the n-side nitride semiconductor layer 10, and the p-side nitride semiconductor layer 20, in succession.

Active Layer 5

The active layer 5 includes a plurality of stacks 5bw, each including a well layer and a barrier layer. In the embodiment shown in FIG. 2, the active layer 5 is a stack structure having three stacks 5bw, in each of which a barrier layer and a well layer are successively stacked from the n-side nitride semiconductor layer 10 side.

A nitride semiconductor containing In, for example, may be used as a well layer, and suitably setting the In composition ratio allows for the emission of blue or green light. In the case of using $In_XAl_YGa_{1-X-Y}N$ $(0 \leq X, 0 \leq Y, X+Y \leq 1)$, for example, by setting the In composition ratio x to a desired value, a peak emission wavelength in the 430 nm to 570 nm range, preferably in a range of 500 nm to 570 nm, can be achieved for the nitride semiconductor light emitting element.

Figure 2:
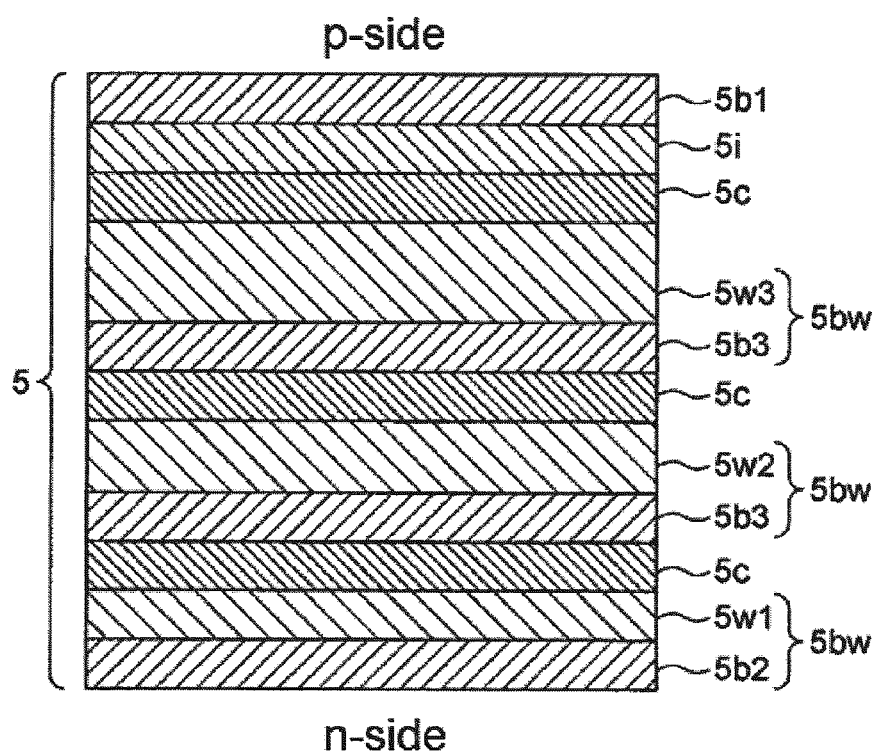
FIG. 2 is a schematic diagram of the structure of the active layer of a nitride semiconductor light emitting element according to a first embodiment of the present disclosure.

As shown in FIG. 2, the well layers in the active layer 5 include, successively from the n-side nitride semiconductor layer 10 side, the first well layer 5w1, the second well layer 5w2, and the third well layer 5w3 that is positioned closest to the p-side nitride semiconductor layer 20 among the well layers. A first interlayer 5c may be stacked on each well layer in order to reduce the decomposition of the InGaN used in the first well layer 5w1, the second well layer 5w2, and the third well layer 5w3. An undoped GaN layer, for example, may be used for each first interlayer 5c.

The thickness of the first well layer 5w1, as described earlier, is smaller than that of the well layers positioned closer to the p-side nitride semiconductor layer 20 than the first well layer 5w1. When structured in this manner, more electrons can be supplied to the well layers that are positioned closer to the p-side nitride semiconductor layer 20, and a nitride semiconductor light emitting element having a low forward voltage can be provided. The thickness of the first well layer 5w1 can be set to fall within, for example, a range of 0.5 nm to 4.0 nm, preferably a range of 1.0 nm to 2.5 nm, more preferably a range of 1.2 to 1.9 nm. The thickness of the first well layer 5w1 is set by taking into consideration the relationship with the other well layers, specifically, the second well layer 5w2 and the third well layer 5w3.

The second well layer 5w2 that has a larger thickness than the first well layer 5w1, but a smaller thickness than the third well layer 5w3, is a layer that contributes to emission and for reducing the crystallinity degradation. The thickness of the second well layer 5w2 can be set to fall within, for example, a range of 1.5 nm to 5.0 nm, preferably a range of 2.0 to 3.5 nm, more preferably a range of 2.5 to 3.2 nm. The thickness of the second well layer 5w2 is set by taking into consideration the relationship with the other well layers, specifically, the first well layer 5w1 and the third well layer 5w3.

The third well layer 5w3 that is amply supplied with holes from the p-side nitride semiconductor layer 20 is a well layer that predominantly contributes to light emission among the well layers. Accordingly, the thickness of the third well layer 5w3 is set larger than that of the other well layers including the first well layer 5w1 so as to allow radiative recombination to occur efficiently in the third well layer 5w3. The thickness of the third well layer 5w3 can be set to fall within, for example, a range of 2.0 nm to 5.5 nm, preferably a range of 2.5 nm to 4.0 nm, more preferably a range of 2.8 to 3.5 nm. The thickness of the third well layer 5w3 is set by taking into consideration the relationship with the other well layers, specifically, the first well layer 5w1 and the second well layer 5w2.

As an example of the thickness of each well layer, the first well layer 5w1, the second well layer 5w2, and the third well layer 5w3 may have a thickness of 1.5 nm, 2.8 nm, and 3.2 nm, respectively. Such a layering structure can reduce the electron trapping effect of the first well layer $5w1$, which does not significant contribute to emission, thereby allowing electrons and holes to be more readily supplied to the second well layer $5w2$ and the third well layer $5w3$. This therefore can improve the emission efficiency of the nitride semiconductor light emitting element. Moreover, providing the second well layer $5w2$ between the first well layer $5w1$ and the third well layer $5w3$ can moderate the thickness change from that of the first well layer $5w1$ to that of the third well layer $5w3$, which can reduce the crystallinity degradation of the third well layer $5w3$.

The barrier layers in the active layer 5 are made of a material that allows carriers to be trapped in the well layers, and may be made of, for example, GaN, InGaN, or AlGaN having a larger band gap energy than the well layers.

The barrier layers include a first barrier layer $5b1$ that is positioned closest to the p-side nitride semiconductor layer 20, a second barrier layer $5b2$ that is positioned closest to the n-side nitride semiconductor layer 10, and a third barrier layer $5b3$ positioned between the first barrier layer $5b1$ and the second barrier layer $5b2$.

The first barrier layer $5b1$ is positioned between the p-side nitride semiconductor layer 20 and the third well layer $5w3$. The first barrier layer $5b1$ is doped with a p-type impurity in order to efficiently inject holes into the third well layer $5w3$ or the second well layer $5w2$. The p-type impurity may be Mg or the like. The thickness of the first barrier layer $5b1$ may be set to fall within, for example, a range of 3 nm to 30 nm, preferably a range of 8 nm to 18 nm, more preferably a range of 12 nm to 14 nm. Setting the thickness of the first barrier layer $5b1$ to at least 3 nm can reduce the carrier injection efficiency decline. Setting the thickness of the first barrier layer $5b1$ to 30 nm at most can improve the crystallinity of the first barrier layer $5b1$.

The second barrier layer $5b2$ and the third barrier layers $5b3$ may be doped with an n-type impurity in order to reduce the forward voltage. For example, the first barrier layer $5b1$ is doped with a p-type impurity, and the second barrier layer $5b2$ and the third barrier layers $5b3$ may be doped with an n-type impurity. In the case of doping with an n-type impurity, the n-type impurity concentration of a third barrier layer $5b3$ is preferably set lower than the n-type impurity concentration of the second barrier layer $5b2$. The n-type impurity may be Si or the like. The thickness of the second barrier layer $5b2$ may be set to fall within, for example, a range of 2 nm to 15 nm, preferably a range of 5 nm to 12 nm, more preferably a range of 6 nm to 9 nm. The thickness of each third barrier layer $5b3$ may be set to fall within, for example, a range of 5 nm to 30 nm, preferably a range of 6 nm to 25 nm, more preferably a range of 8 nm to 18 nm. Setting the thickness of the second barrier layer $5b2$ to at least 2 nm can reduce the instances of carrier deficiency. Setting the thickness of the second barrier layer $5b2$ to 15 nm at most can reduce the crystallinity degradation attributable to an increased n-type impurity concentration. Setting the thickness of a third barrier layer $5b3$ to at least 5 nm can improve the crystallinity of the third barrier layer $5b3$. Setting the thickness of a third barrier layer $5b3$ to 30 nm at most can reduce the carrier distribution deterioration in the active layer 5 attributable to a thicker third barrier layer $5b3$.

A third barrier layer $5b3$ may include two semiconductor layers having different n-type impurity concentrations. For example, a third barrier layer may include a semiconductor layer of a first n-type concentration positioned on the n-side nitride semiconductor layer 10 side, and a semiconductor layer of a second impurity concentration lower than the first n-type concentration positioned on the p-side nitride semiconductor layer 20 side.

With respect to the second barrier layer $5b2$ and the third barrier layers $5b3$, in order to efficiently supply carriers to the second well layer $5w2$ and the third well layer $5w3$, the n-type concentration of the second barrier layer $5b2$ may be set higher than the n-type concentration of the third barrier layers $5b3$. This can supply more electrons to the third well layer $5w3$. The n-type impurity concentration of the second barrier layer $5b2$ may be set to fall within, for example, a range of $1 \times 10^{17}/\text{cm}^3$ to $3 \times 10^{19}/\text{cm}^3$, preferably a range of $2 \times 10^{17}/\text{cm}^3$ to $1 \times 10^{19}/\text{cm}^3$, more preferably a range of $3 \times 10^{17}/\text{cm}^3$ to $8 \times 10^{18}/\text{cm}^3$. The n-type impurity concentration of each third barrier layer $5b3$ may be set to fall within, for example, a range of $1 \times 10^{17}/\text{cm}^3$ to $1 \times 10^{19}/\text{cm}^3$, preferably a range of $2 \times 10^{17}/\text{cm}^3$ to $5 \times 10^{18}/\text{cm}^3$, more preferably a range of $3 \times 10^{17}/\text{cm}^3$ to $2 \times 10^{18}/\text{cm}^3$.

A nitride semiconductor light emitting element as constructed above, in which the individual well layers are given different functions and the first barrier layer $5b1$ that is positioned closest to the p-side nitride semiconductor layer 20 is doped with a p-type impurity, can achieve improved emission efficiency.

The construction of the active layer in this embodiment of the present disclosure will be described in more detail below.

As a more preferable form of implementing the well layers, the first well layer $5w1$, the second well layer $5w2$, and the third well layer $5w3$ may all contain In, and the In composition ratio of the first well layer $5w1$, the In composition ratio of the second well layer $5w2$, and the In composition ratio of the third well layer $5w3$ may be set to be equal. The efficiency in supplying carriers to the well layers can be improved by making their In composition ratios equal. For example, providing each well layer with a relatively high In composition ratio, such as 20% to 28%, allows the well layers to emit green light. Here, the In composition ratios being equal includes a case in which the In composition ratio of one well layer differs by +1% from that of another well layer.

As a more preferable form of implementing the well layers, the peak emission wavelength of the light emitted by the second well layer $5w2$ may be set to be equal to the peak emission wavelength of the light emitted by the third well layer $5w3$. Setting the peak emission wavelengths for the well layers to be equal can increase the output of light of the same peak emission wavelength. For example, one emission peak wavelength may be selected for a nitride semiconductor light emitting element 100. Here, the peak emission wavelengths being equal includes a case in which the peak emission wavelength of the light emitted from one well layer differs by +3% from the peak emission wavelength of the light from the other well layer.

As a more preferable form of implementing the barrier layers, a second interlayer $5i$ made of an undoped semiconductor layer may be disposed between the first barrier layer $5b1$ and the third well layer $5w3$. Interposing a second interlayer $5i$ between the p-type impurity doped first barrier layer $5b1$ and the third well layer $5w3$ in this manner can reduce the deterioration in reliability attributable to the diffusion of the p-type impurity contained in the first barrier layer $5b1$ into the third well layer $5w3$. Reducing the deterioration in reliability can, for example, reduce the decline in output of the nitride semiconductor light emitting element 100 with the passage of time.

As a more preferable form of implementing the well layers, the thickness of the third well layer $5w3$ may be set to be at least twice the thickness of the first well layer 5w1. The increased volume of the third well layer 5w3 by this setting can improve the probability of electron-hole radiative recombination in the third well layer 5w3, thereby improving the emission efficiency.

As a more preferable form of implementing the barrier layers, the p-type impurity concentration of the first barrier layer 5b1 may be set lower than the p-type impurity concentration of the p-type barrier layer 6. In the present embodiment, the p-type impurity concentration of the first barrier layer 5b1 is set as $1\times10^{20}/cm^3$ while the p-type impurity concentration of the p-type barrier layer 6 is set as two to three times the p-type impurity concentration of the first barrier layer 5b1. Setting the p-type impurity concentrations in this manner allows the first barrier layer 5b1 to supply holes to the second well layer 5w2 and the third well layer 5w3 while reducing the crystallinity degradation attributable to a heightened p-type impurity concentration, thereby improving the emission efficiency.

The constituent elements of the nitride semiconductor light emitting element other than the active layer 5 will be explained next.

Substrate 1

For the substrate 1 (see FIG. 1), for example, an insulating substrate, such as C-, R-, or A-plane sapphire or spinel ($MgAl_2O_4$) can be used. Among all, in the case of using a nitride semiconductor for the nitride semiconductor light emitting element 100, a C-plane sapphire substrate is preferably used. As the substrate 1, SiC (including 6H, 4H, 3C), ZnS, ZnO, GaAs, Si or the like may alternatively be used. The light emitting element does not have to include a substrate 1 at the end.

N-Side Nitride Semiconductor Layer 10

As shown in FIG. 1, the n-side nitride semiconductor layer 10 includes successively from the substrate 1 side, a base layer 2, an n-side contact layer 3, and an n-side superlattice layer 4. The n-side nitride semiconductor layer 10 includes at least one n-type semiconductor layer containing an n-type impurity. For the n-type impurity, for example, Si, Ge, or the like can be used.

The base layer 2 is disposed between the substrate 1 and the n-side contact layer 3. Providing a base layer 2 allows for the formation of a high crystallinity n-side contact layer 3 on the upper face of the base layer 2. The base layer 2 may be, for example, AlGaN or GaN. A buffer layer may be formed between the base layer 2 and the substrate 1. The buffer layer is a layer for reducing the lattice mismatch between the substrate 1 and the base layer 2, and for example, undoped AlGaN or GaN can be used.

The n-side contact layer 3 is disposed on the upper face of the base layer 2, and contains an n-type impurity at least in one portion. As shown in FIG. 1, an n-electrode 8 is formed on the upper face of the n-side contact layer 3. Because the n-side contact layer 3 supplies electrons from the n-electrode 8 to the active layer 5, it is preferably doped with a relatively high concentration of an n-type impurity. The n-type impurity concentration of the n-side contact layer 3 can be set to fall within, for example, a range of $6\times10^{18}$ to $1\times10^{19}/cm^3$. The n-side contact layer 3 is preferably made of GaN, AlGaN, AlN, or InGaN. The n-side contact layer 3 may have a multilayer structure in which, for example, undoped GaN and GaN doped with an n-type impurity are alternately stacked. The thickness of the n-side contact layer 3 may be, for example, 5 μm to 20 μm.

The n-side superlattice layer 4 is disposed on the upper face of the n-side contact layer 3. Providing an n-side superlattice layer 4 can reduce lattice relaxation between the n-side contact layer 3 and the active layer 5, thereby improving the crystallinity of the active layer 5. The n-side superlattice layer 4 has a structure in which semiconductor layers having different lattice constants are alternately stacked. The n-side superlattice layer 4 includes, for example, n pairs of an undoped InGaN layer and an undoped GaN layer. The number of pairs n may be set to fall within, for example, a range of 10 to 40, preferably a range of 15 to 35, more preferably a range of 25 to 35.

P-Side Nitride Semiconductor Layer 20

As shown in FIG. 1, the p-side nitride semiconductor layer 20 includes successively from the active layer 5 side, a p-type barrier layer 6 and a p-side contact layer 7. The p-side nitride semiconductor layer 20 includes at least one p-type semiconductor layer containing a p-type impurity. For the p-type impurity, for example, Mg or the like can be used.

The p-type barrier layer 6 of the p-side nitride semiconductor layer 20 is positioned closest to the active layer 5. The p-type barrier layer 6 is a layer disposed to trap electrons, and may be constructed with, for example, GaN or AlGaN containing a p-type impurity such as Mg or the like. The band gap energy of the p-type barrier layer 6 is larger than the band gap energy of the first barrier layer 5b1 of the active layer 5. The thickness of the p-type barrier layer 6 can be set, for example, as 10 nm to 50 nm. The p-type impurity concentration of the p-type barrier layer 6 can be set, for example, to $2\times10^{20}/cm^3$ to $6\times10^{20}/cm^3$.

The p-side contact layer 7 is a layer on which a p-electrode 9 is formed. The p-side contact layer 7 may be constructed with, for example, GaN or AlGaN containing a p-type impurity such as Mg. The thickness of the p-side contact layer 7 may be, for example, 10 nm to 150 nm.

As explained above, according to the nitride semiconductor light emitting element 100 of the present embodiment, the first well layer 5w1, the second well layer 5w2, and the third well layer 5w3 included in the active layer are formed to have different thicknesses. In addition, the first barrier layer 5b1 is doped with a p-type impurity to thereby increase the efficiency in supplying holes to the third well layer 5w3, among the well layers of the active layer 5, that is positioned closest to the p-side nitride semiconductor layer 20 to promote the emission efficiency improvement.

Second Embodiment

Next, a second embodiment of the present disclosure will be explained with reference to FIG. 3. The explanation of the same constituent elements as those in the first embodiment will be omitted. In the first embodiment described earlier, an embodiment in which a single layer was provided for each of the first well layer 5w1, the second well layer 5w2, and the third well layer 5w3 was explained. For the second embodiment, an embodiment in which multiple layers are provided for the first and second well layers 5w1 and 5w2, and a single layer for the third well layer 5w3 will be explained as an example.

Figure 3:
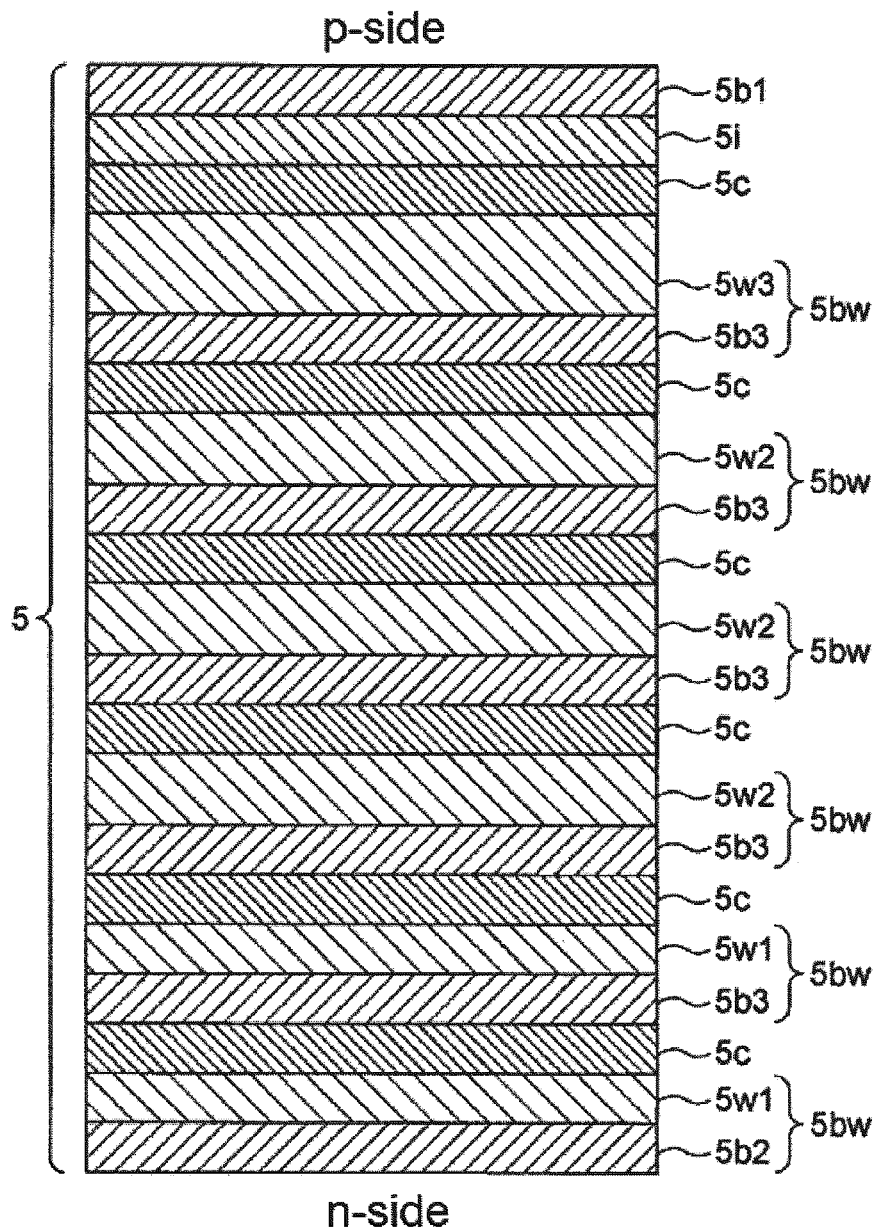
FIG. 3 is a schematic diagram of the structure of the active layer of a nitride semiconductor light emitting element according to a second embodiment of the present disclosure.

For example, the active layer 5 of the second embodiment, as shown in FIG. 3, may include two first well layers 5w1, three second well layers 5w2, and one third well layer 5w3. As mentioned in the description of the first embodiment, the first well layers 5w1, which are scarcely supplied with holes, are layers that do not significantly contribute to emission, whereas the second well layers 5w2 and the third well layer 5w3 are the layers that contribute to emission. In the second embodiment, similar to the first embodiment, the thickness of each first well layer 5w1 is smaller than the thickness of each second well layer 5w2, the thickness of each second well layer 5w2 is larger than the thickness of each first well layer 5w1, and the thickness of the third well layer 5w3 is larger than the thickness of each second well layer 5w2. As one example of the thickness of each well layer, each first well layer 5w1, each second well layer 5w2, and the third well layer 5w3 may be set to be 1.5 nm, 2.8 nm, and 3.2 nm in thickness, respectively.

In this embodiment, the active layer 5 includes multiple first well layers 5w1 and multiple second well layers 5w2. Providing multiple first well layers 5w1 allows for the formation of a higher crystallinity second well layer 5w2. Providing multiple second well layers 5w2 that contribute to emission can further improve the emission efficiency.

As a preferable form of implementing the well layers, a quantity of the second well layers 5w2 may be greater than a quantity of the first well layers 5w1. As an example, the case having three second well layers 5w2 and two first well layers 5w1 is shown in FIG. 3. The quantity of the second and first well layers 5w2 and 5w1 are not limited to these, and for example, the quantity may be set as seven for the second well layers 5w2 and five for the first well layers 5w1. Providing more second well layers 5w2 than the first well layers 5w1 can reduce the supply of holes to the first well layers 5w to allow more holes to be supplied to the second well layers 5w2 and the third well layer 5w3, thereby improving the emission efficiency.

Furthermore, as a preferable form of implementing the well layers, the quantity of third well layers 5w3 may be set as one. Because of the larger thickness than the other well layers and the close proximity to the p-type barrier layer 6, the third well layer 5w3 is supplied with a larger number of holes. This can improve the emission efficiency of the nitride semiconductor light emitting element 100. This can also reduce the crystallinity degradation as compared to the case of providing multiple third well layers 5w3.

A method of manufacturing a nitride semiconductor light emitting element according to the present disclosure includes an n-side nitride semiconductor layer forming process, an active layer forming process, a p-side nitride semiconductor layer forming process, and an electrode forming process. The n-side nitride semiconductor layer forming process includes forming a base layer, forming an n-side contact layer, and forming an n-side superlattice layer. The p-side nitride semiconductor layer forming process includes forming a p-type barrier layer and forming a p-side contact layer. The method of manufacturing a nitride semiconductor light emitting element according to the present disclosure will be explained below in succession.

Base Layer Forming Process

First, a base layer 2 is formed on, for example, the C-plane of a sapphire substrate 1 by metal-organic chemical vapor deposition (MOCVD). A buffer layer may be formed on the substrate 1 before forming a base layer 2, followed by forming a base layer 2 via the buffer layer. Here, the buffer layer is formed by growing AlGaN on the substrate 1, for example, by setting the growth temperature at 600° C. at most and using TMA (trimethyl aluminum), TMG (trimethyl gallium), and ammonia as source gases. The base layer 2 is formed by growing a GaN layer on the buffer layer by using, for example, TMG and ammonia as source gases.

N-Side Contact Layer Forming Process

In the n-side contact layer forming process, an n-side contact layer 3 is formed by growing a GaN layer doped with an n-type impurity. In growing a GaN layer doped with an n-type impurity, TMG and ammonia are used as source gases, and monosilane as an n-type impurity gas. The growth temperature for the n-side contact layer 3 may be set, for example, at 1150° C.

N-Side Superlattice Layer Forming Process

In the n-side superlattice layer forming process, an n-side superlattice layer 4 is formed by alternately stacking undoped GaN layers and undoped InGaN layers. The growth temperature for the n-side superlattice layer 4 is preferably set lower than the growth temperature for the n-side contact layer 3 and can be set, for example, at about 910° C. In growing undoped GaN layers, TEG (triethyl gallium), ammonia, and the like are used as source gases. In growing undoped InGaN layers, TEG, TMI (trimethyl indium), ammonia and the like are used as source gases. When growing undoped GaN layers, a gas containing $H_2$ may be used as a carrier gas. Using such a carrier gas can reduce the formation of V-pits on the surface of a GaN layer. Here, V-pits refer to concaves created on the surface of a semiconductor layer attributable to the dislocation generated in the semiconductor.

Active Layer Forming Process

The active layer forming process includes a barrier layer forming process and a well layer forming process. In the barrier layer forming process, a barrier layer is formed by growing GaN by setting the growth temperature at 950° C., for example, and using TEG and ammonia as source gases. In the well layer forming process, a well layer is formed by growing InGaN by setting the growth temperature at 800° C., for example, and using TEG, TMI, ammonia and the like as source gases. By alternately performing the barrier layer forming process and the well layer forming process multiple times, an active layer that includes multiple barrier layers and multiple well layers can be formed. In order to reduce the decomposition of the InGaN used as a well layer, a first interlayer 5c may be formed on the upper face of the well layer, followed by forming a barrier layer on the upper face of the first interlayer 5c. For each first interlayer 5c, an undoped GaN layer may be grown by using TEG and ammonia as source gases.

In this embodiment, as shown in FIG. 3, a stack 5bw made up of a second barrier layer 5b2 and a first well layer 5w1, a stack 5bw made up of a third barrier layer 5b3 and a first well layer 5w1, a stack 5bw made up of a third barrier layer 5b3 and a second well layer 5w2, a stack 5bw made up of a third barrier layer 5b3 and a second well layer 5w2, a stack 5bw made up of a third barrier layer 5b3 and a second well layer 5w2, and a stack 5bw made up of a third barrier layer 5b3 and a third well layer 5w3 are grown. In other words, two first well layers 5w1, three second well layers 5w2, and one third well layer 5w3 are grown. The first well layers 5w1, the second well layers 5w2, and the third well layer 5w3 are formed such that the thicknesses increase in that order.

As a more preferable form, when growing each third barrier layer 5b3, a GaN layer doped with an n-type impurity may be grown by using monosilane as an n-type impurity gas.

Furthermore, an undoped GaN layer may be formed as a second interlayer 5i on the upper face of the third well layer 5w3 in order to reduce the reliability deterioration attributable to the diffusion of the p-type impurity into the well layer. A GaN layer doped with a p-type impurity may be formed as a first barrier layer 5b1 on the upper face of the second interlayer 5i in order to increase the efficiency in supplying holes to the second well layers 5w2 and the third well layer 5w3. $Cp_2Mg$ (bis(cyclopentadienyl)magnesium) may be used as a p-type impurity gas. The Mg impurity concentration is preferably about ½ to ⅓ of the p-type impurity concentration of the p-type barrier layer 6. The Mg impurity concentration may be controlled by controlling the impurity gas flow rate or the like.

P-Type Barrier Layer Forming Process

In the p-type barrier layer forming process, an AlGaN layer containing a p-type impurity is formed as a p-type barrier layer 6 by using, for example, TEG, TMA, and ammonia as source gases, and $Cp_2Mg$ (bis(cyclopentadienyl)magnesium) as a p-type impurity gas.

P-Side Contact Layer Forming Process

In the p-side contact layer forming process, an undoped GaN layer is grown by using, for example, TMG, TMA, and ammonia as source gases. Subsequently, on the undoped GaN layer a p-side contact layer 7 is formed by growing a GaN layer containing a p-type impurity by using TMG, TMA, and ammonia as source gases and $Cp_2Mg$ (bis(cyclopentadienyl)magnesium) as a p-type impurity gas. The impurity concentration of the p-side contact layer 7 is preferably set higher than that of the p-type barrier layer 6.

After growing the semiconductor layers in the processes described above, the wafer is annealed in a reaction chamber in a nitrogen atmosphere at a temperature, for example, of about 700° C.

Electrode Forming Process

After annealing, a portion of the surface of the n-side contact layer 3 is exposed by partially removing the p-side nitride semiconductor layer 20, the active layer 5, and the n-side nitride semiconductor layer 10.

Subsequently, a p-electrode 9 is formed on a portion of the surface of the p-side contact layer 7, and an n-electrode 8 is formed on a portion of the exposed surface of the n-side contact layer 3. By following the processes described above, a nitride semiconductor light emitting element 100 is produced.

As described above, the method of manufacturing a nitride semiconductor light emitting element of this embodiment can manufacture a nitride semiconductor light emitting element capable of promoting the emission efficiency improvement by varying the thicknesses of the first well layers $5w1$, the second well layers $5w2$, and the third well layer $5w3$ included in the active layer 5 and doping the first barrier layer $5b1$ with a p-type impurity.

Example

One preferable example of a nitride semiconductor light emitting element according to the present disclosure will be explained. As a substrate 1, a sapphire substrate was used.

A buffer layer made of an undoped AlGaN layer was formed on the upper face of the substrate 1. A base layer 2 including GaN was formed on the buffer layer.

Next, an n-side contact layer 3 was formed on the upper face of the base layer 2. The n-side contact layer 3 was a GaN layer doped with Si as an n-type impurity. The thickness of the n-side contact layer 3 was about 8 m.

Then an n-side superlattice layer 4 was formed on the upper face of the n-side contact layer 3. The n-side superlattice layer 4 was formed to include the multiple semiconductor layers described below. First, an Si doped GaN layer of about 80 nm in thickness was formed. This was followed by forming 27 pairs of about a 3 nm thick undoped GaN layer and about a 1.5 nm thick undoped InGaN layer. Then three pairs of about a 3 nm thick undoped GaN layer and about a 1.5 nm thick Si doped InGaN layer were formed.

Lastly, six pairs of about a 10 nm thick Si doped AlGaN layer and about a 1 nm thick Si doped InGaN layer were formed.

Next, an active layer 5 was formed on the upper face of the n-side superlattice layer 4. The active layer 5 was formed to include the multiple well layers and the multiple barrier layers described below.

First, as a second barrier layer $5b2$, about a 6 nm thick Si doped InGaN layer, about a 2.3 nm thick undoped GaN layer, and about a 0.6 nm thick undoped GaN layer were formed. Then as a first well layer $5w1$, about a 1.6 nm thick undoped InGaN layer was formed, which was followed by forming about a 1.6 nm thick undoped GaN layer as a first interlayer $5c$.

Next, about a 16.3 nm thick Si doped GaN layer was formed as a third barrier layer $5b3$, about a 1.6 nm thick undoped InGaN layer was formed as a first well layer $5w1$, and about 1.6 nm thick undoped GaN layer was formed as a first interlayer $5c$. These processes of forming a third barrier layer $5b3$, a first well layer $5w1$, and an interlayer $5c$ were repeated four times.

Next, about a 16.3 nm thick Si doped GaN layer was formed as a third barrier layer $5b3$, about a 3.0 nm thick undoped InGaN layer was formed as a second well layer $5w2$, and about 1.6 nm thick undoped GaN layer was formed as a first interlayer $5c$. These processes of forming a third barrier layer $5b3$, a second well layer $5w2$, and an interlayer $5c$ were repeated three times.

Next, about a 10 nm thick Si doped GaN layer was formed as a third barrier layer $5b3$, about a 3.0 nm thick undoped InGaN layer was formed as a second well layer $5w2$, and about a 1.6 nm thick undoped GaN layer was formed as a first interlayer $5c$. These processes were repeated four times.

Next, about a 10 nm thick Si doped GaN layer was formed as a third barrier layer $5b3$, about a 3.4 nm thick undoped InGaN layer was formed as a third well layer $5w3$, about a 1.6 nm thick undoped GaN layer was formed as a first interlayer $5c$, and about a 5.3 nm thick undoped GaN layer was formed as a second interlayer $5i$.

Then as a first barrier layer $5b1$, about a 13.1 nm thick Mg doped GaN layer was formed. At this time, the first barrier layer $5b1$ was formed to have a p-type impurity concentration of about $1.3 \times 10^{19}/cm^3$.

By forming the semiconductor layers described above, the active layer 5 that included multiple well layers and multiple barrier layers was formed. The active layer 5 of the present example had five first well layers $5w1$, seven second well layers $5w2$, and one third well layer $5w3$. For each of the first well layers $5w1$, the second well layers $5w2$, and the third well layer $5w3$, the In composition ratio of the InGaN layer was 25%.

On the upper face of the active layer 5, a p-type barrier layer 6 of about 11 nm in thickness was formed. The p-type barrier layer 6 was an AlGaN layer containing Mg as a p-type impurity. In the p-type barrier layer 6, the Al composition ratio was set to be about 12.5%. The p-type barrier layer 6 was formed to have a p-type impurity concentration of about $4 \times 10^{20}/cm^3$.

On the upper face of the p-type barrier layer 6, a p-side contact layer 7 was formed. The p-side contact layer 7 was formed by first forming about an 80 nm thick undoped GaN layer followed by forming about a 20 nm thick Mg doped GaN layer.

After growing the semiconductor layers as described above, the wafer was heat treated in the reaction chamber in a nitrogen atmosphere at about 700° C.

After the heat treatment, a portion of the surface of the n-side contact layer 3 was exposed by partially removing the p-side nitride semiconductor layer 20, the active layer 5, and the n-side nitride semiconductor layer 10.

Subsequently, a p-electrode 9 was formed on a portion of the surface of the p-side contact layer 7, and an n-electrode 8 was formed on a portion of the exposed surface of the n-side contact layer 3.

In the present example described above, the emission efficiency of the nitride semiconductor light emitting element measured when applying a 100 mA current was 43.9%.

The embodiments disclosed in the foregoing are provided for exemplification purposes in every respect, and do not constitute any ground for limited interpretations. Accordingly, the technical scope of the present invention shall not be interpreted based solely on the embodiments described above, but rather is defined by the scope of claims. The technical scope of the present invention encompasses the meanings equivalent to the scope of claims and all modifications that can be made within the scope.

What is claimed is:

1. A nitride semiconductor light emitting element comprising:
    an n-side nitride semiconductor layer;
    a p-side nitride semiconductor layer; and
    an active layer disposed between the n-side nitride semiconductor layer and the p-side nitride semiconductor layer, wherein the active layer comprises:
      one or more first stacks, each of the one or more first stacks comprising a first barrier layer and a first well layer located on the first barrier layer,
      one or more second stacks located above the one or more first stacks, each of the one or more second stacks comprising a second barrier layer and a second well layer located on the second barrier layer,
      one or more first interlayers, each located on the second well layer of a respective one of the one or more second stacks,
      a third stack located above the one or more second stacks and comprising a third barrier layer and a third well layer located on the third barrier layer,
      a second interlayer located on the third well layer,
      a third interlayer located on the second interlayer, and
      a fourth barrier layer located on the third interlayer, wherein:
      each of the first interlayer, the second interlayer, and the third interlayer is an undoped semiconductor layer,
      a thickness of the second well layer of each of the one or more second stacks is greater than a thickness of the first well layer of each of the one or more first stacks,
      a thickness of the third well layer is greater than the thickness of the second well layer of each of the one or more second stacks, and
      the fourth barrier layer is doped with a p-type impurity.

2. The nitride semiconductor light emitting element according to claim 1, wherein:
    the second barrier layer of each of the one or more second stacks is doped with an n-type impurity.

3. The nitride semiconductor light emitting element according to claim 2, wherein:
    the one or more first stacks comprise a plurality of first stacks, and
    the one or more second stacks comprise a plurality of second stacks.

4. The nitride semiconductor light emitting element according to claim 3, wherein:
    a quantity of the one or more second stacks is greater than a quantity of the one or more first stacks.

5. The nitride semiconductor light emitting element according to claim 2, wherein:
    the thickness of the third well layer is at least twice the thickness of the first well layer in each of the one or more first stacks.

6. The nitride semiconductor light emitting element according to claim 2, wherein:
    the p-side nitride semiconductor layer comprises a p-type barrier layer positioned closest to the active layer and containing a p-type impurity, and
    a p-type impurity concentration of the first fourth barrier layer is lower than a p-type impurity concentration of the p-type barrier layer.

7. The nitride semiconductor light emitting element according to claim 2, wherein:
    the first well layer of each of the one or more first stacks, the second well layer of each of the one or more second stacks, and the third well layer all contain In, and
    the first well layer of each of the one or more first stacks, the second well layer of each of the one or more second stacks, and the third well layer have equal In composition ratios.

8. The nitride semiconductor light emitting element according to claim 2, wherein:
    a peak emission wavelength of light from the second well layer of each of the one or more second stacks is equal to a peak emission wavelength of the light from the third well layer.

9. The nitride semiconductor light emitting element according to claim 1, wherein:
    the one or more first stacks comprise a plurality of first stacks, and
    the one or more second stacks comprise a plurality of second stacks.

10. The nitride semiconductor light emitting element according to claim 9, wherein:
    a quantity of the one or more second stacks is greater than a quantity of the one or more first well layers stacks.

11. The nitride semiconductor light emitting element according to claim 10, wherein:
    a quantity of the third well layers stack is one.

12. The nitride semiconductor light emitting element according to claim 9, wherein:
    a quantity of the third well layer is one.

13. The nitride semiconductor light emitting element according to claim 1, wherein:
    the thickness of the third well layer is at least twice the thickness of the first well layer in each of the one or more first stacks.

14. The nitride semiconductor light emitting element according to claim 1, wherein:
    the p-side nitride semiconductor layer comprises a p-type barrier layer positioned closest to the active layer and containing a p-type impurity, and
    a p-type impurity concentration of the fourth barrier layer is lower than a p-type impurity concentration of the p-type barrier layer.

15. The nitride semiconductor light emitting element according to claim 1, wherein:
    the first well layer of each of the one or more first stacks, the second well layer of each of the one or more second stacks, and the third well layer all contain In, and the first well layer of each of the one or more first stacks, the second well layer of each of the one or more second stacks, and the third well layer have equal In composition ratios.

16. The nitride semiconductor light emitting element according to claim 1, wherein:
a peak emission wavelength of light from the second well layer of each of the one or more second stacks is equal to a peak emission wavelength of the light from the third well layer.

17. The nitride semiconductor light emitting element according to claim 1, wherein:
the active layer further comprises one or more additional interlayers, each located on the first well layer of a respective one of the one or more first stacks.

* * * * *